(12) United States Patent
Ohyama et al.

(10) Patent No.: US 6,802,040 B1
(45) Date of Patent: Oct. 5, 2004

(54) ERROR CORRECTION DEVICE

(75) Inventors: Tatsushi Ohyama, Ogaki (JP); Toru Arisaka, Ota (JP); Hideki Yamauchi, Ogaki (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 504 days.

(21) Appl. No.: 09/714,649

(22) Filed: Nov. 17, 2000

(30) Foreign Application Priority Data

Nov. 24, 1999 (JP) ............................................ 11-332245
May 23, 2000 (JP) ........................................ 2000-151769

(51) Int. Cl.[7] ........................ G06F 11/00; H03M 13/00
(52) U.S. Cl. ...................... 714/781; 714/746; 714/784; 714/785
(58) Field of Search ................................ 714/785, 769, 714/755, 781, 746; 713/176, 200

(56) References Cited

U.S. PATENT DOCUMENTS

| | | | |
|---|---|---|---|
| 5,920,578 A | 7/1999 | Zook | 371/37.4 |
| 5,974,580 A | 10/1999 | Zook et al. | 714/755 |
| 6,032,283 A | 2/2000 | Meyer | 714/746 |
| 6,131,178 A | 10/2000 | Fujita et al. | 714/784 |
| 6,158,038 A | 12/2000 | Yamawaki et al. | 714/755 |
| 6,415,411 B1 | 7/2002 | Nakamura | 714/755 |
| 6,553,533 B2 * | 4/2003 | Demura et al. | 714/769 |
| 6,556,679 B1 * | 4/2003 | Kato et al. | 380/203 |
| 2001/0014960 A1 | 8/2001 | Ohyama et al. | 714/755 |
| 2001/0052099 A1 | 12/2001 | Yano et al. | 714/755 |
| 2002/0095638 A1 | 7/2002 | Weng et al. | 714/785 |

FOREIGN PATENT DOCUMENTS

| | | |
|---|---|---|
| EP | 0 821 493 A1 | 1/1998 |
| EP | 0 905 911 A2 | 3/1999 |
| JP | 08 125549 | 5/1996 |
| JP | 2605270 | 2/1997 |
| JP | 2605271 | 2/1997 |
| JP | 2714129 | 10/1997 |
| JP | 11 232039 | 8/1999 |
| JP | 11-282703 | 10/1999 |
| JP | 11 338723 | 12/1999 |
| JP | 2000 010807 | 1/2000 |
| JP | 2000-106530 | 4/2000 |
| JP | 2000-1149883 | 4/2000 |
| WO | 99/48097 | 9/1999 |

OTHER PUBLICATIONS

Japanese Office Action/Patent Search Report—dated Dec. 4, 2001.
Chang, H.–C., "A Reed–Solomon Product–Code (RS–PC) Decoder for DVD Applications" *IEEE International Solid State Circuits Conference*, IEEE Inc., New York, vol. 41, Feb. 1998 (Feb. 1998), pp. 390–391, 470.

* cited by examiner

*Primary Examiner*—Emmanuel L. Moise
(74) *Attorney, Agent, or Firm*—Armstrong, Kratz, Quintos, Hanson & Brooks, LLP

(57) ABSTRACT

An error correction circuit includes a first error correction operation circuit subjecting to error correction a code of a line of a PI system in a data block including a product code that is stored in a buffer memory, and a second error correction operation circuit subjecting a PO-system line code to error correction. Data corrected by the first error correction circuit is transferred to the second error correction operation circuit at a second syndrome calculation circuit including a storage element storing a development of a syndrome calculation. Whenever PI-system line data corrected is received, the second syndrome calculation circuit reads corresponding data from the storage element and calculates a syndrome and overwrites the obtained value on old data stored in the storage element.

17 Claims, 16 Drawing Sheets

FIG. 2

| | COL0 | COL1 | COL2 | ... | COL180 | COL181 |
|---|---|---|---|---|---|---|
| ROW0 | y0 | y1 | y2 | .. | y180 | y181 |
| ROW1 | y0 | y1 | y2 | .. | y180 | y181 |
| ROW2 | y0 | y1 | y2 | .. | y180 | y181 |
| .. | .. | .. | .. | .. | .. | .. |
| ROW206 | y0 | y1 | y2 | .. | y180 | y181 |
| ROW207 | y0 | y1 | y2 | .. | y180 | y181 |

ERROR CORRECTION DEVICE

BACKGROUND OF THE INVENTION

1. Field of the Invention

The present invention relates generally to error correction devices and particularly to error correction devices successively providing error correction for a code in each direction for a data block including a product code.

2. Description of the Background Art

In environments transmitting digital data, such as digital transmission systems, peripheral apparatuses for computers and the like, error correction codes are typically used to more reliably transmit digital data. In particular, in recent years an error correction code having a high correction capability is used as a digital data receiving and decoding side is enhanced in data processing capability.

A representative one of such error correction codes is a product code, which has two long-distance codes with large code length and redundancy.

FIG. 13 schematically shows a manner in which such a product code is added to digital data (information symbol).

With reference to FIG. 13, the product code is typically a combination of error correction codes provided in different directions, i.e., vertical and horizontal directions. More specifically, the product code is configured of a parity PO corresponding to an external code added to the information symbol in the vertical direction and a parity PI corresponding to an internal code added to the information symbol and parity PO in the horizontal direction.

Each error correction code is often a Reed-Solomon code (hereinafter referred to as an RS code) capable of byte-by-byte error correction. In the FIG. 13 example, the error correction code in the PO direction is an RS code having a code length $n_0(=208)$, an information length $k_0(=192)$ and a minimal distance $d_0(=17)$, and the error correction code in the PI direction is an RS code having a code length $n_i(=182)$ an information length $k_i(=172)$ and a minimal distance $d_i(=11)$.

Theoretically, there are established relationships of $d_i \geq 2t_i+1$ and $d_0 \geq 2t_0+1$, wherein $t_i$ and to are each a number of errors that can be corrected.

If a receiving and decoding apparatus decodes or corrects errors of a data block including a product code with RS error correction codes added in two directions, error correction in each direction is typically repeated, again and again.

FIG. 14 is a block diagram simply showing a data transmission path in an error correction process of such a first conventional error correction device.

With reference to FIG. 14, digital data read for example from a DVD is transmitted on a data bus 51, provided in the form of a data block including a product code, as shown in FIG. 13, and it is thus stored temporarily in a buffer memory 52. Buffer memory 52 typically has a large capacity of no less than 4 Mbit to store a plurality of product-code blocks at one time. As such, a dynamic random access memory (DRAM), a synchronous dynamic random access memory (SDRAM) or the like is mainly used as buffer memory 52 as it has a large capacity, occupies a small area and is not costly.

Then the data stored in buffer memory 52 are successively read and an error correction circuit 53 provides error correction for the code in each direction. Correcting errors with a Reed-Solomon code typically follows the following 4-step procedure:

(1) Calculate a syndrome from received data;
(2) Obtains an error location polynomial and an error estimation polynomial from the syndrome;
(3) Obtain an error location from the error location polynomial; and
(4) Obtain an error count value from the error location polynomial, the error estimation polynomial and the error location, and corrects the obtained error count value.

If a Reed-Solomon code having a high correction capability is used to correct an error, Euclidean algorithm obtaining the greatest common divider of two polynomials may be applied as one technique of obtaining an error location polynomial and an error estimation polynomial from a syndrome in step (2).

FIG. 15 is a schematic block diagram showing a configuration of error correction circuit 53. Error correction circuit 53 is configured of a syndrome calculation circuit 54 provided for calculating a syndrome from data input, a Euclidean execution circuit 55 provided for obtaining an error location polynomial and an error estimation polynomial from a syndrome, a Chien search execution circuit 56 obtaining an error location and an error count value from an error location polynomial and an error estimation polynomial, and a correction circuit 57 providing a correction based on an error location and an error count value.

In the FIG. 13 product-code block, for example, the horizontal, PI-system data is subjected to a calculation of a syndrome, a calculation of an error location polynomial and an error count value polynomial by means of a Euclidean method, and a calculation of an error location and an error value by means of a Chien search method, and on buffer memory 52 an error is corrected.

Then, the vertical, PO-system data is subjected to a calculation of a syndrome, a calculation of an error location polynomial and an error count value polynomial by means of a Euclidean method, and a calculation of an error location and an error value by means of a Chien search method, and on buffer memory 52 an error is corrected.

Such a process is repeated for each system to correct an error in an information symbol. If this error correction process is repeated more frequently, more errors can be corrected in general.

In the FIG. 14 example, a buffer memory 52 comprises, for instance, a dynamic random access memory (D)RAM). Horizontal, PI-system data stored in the buffer memory 52 can be accessed in burst and thus read rapidly. However, vertical, PO-system data are accessed randomly and thus read in a long period of time, disadvantageously resulting in a reduced correction rate.

To overcome this disadvantage, there is provided a second conventional error correction device having a configuration illustrated in FIG. 16, shown in a schematic block diagram.

As shown in FIG. 16, the second conventional error correction device has added thereto a storage element 58 formed of a static random access memory (SRAM) rapidly accessible for both of data in a vertical direction and data in a horizontal direction. In accessing horizontal, PI-system data stored in buffer memory 52, the data of a product code block are all written to storage element 58. More specifically, there is proposed that if the vertical, PO-system data is accessed, a product code block stored in storage element 58 is accessed to allow the vertical, PO-system data to also be accessed rapidly.

In the conventional example as shown in FIG. 16, however, storage element 58 corresponding to an SRAM is enormously increased in capacity, disadvantageously resulting in an increased circuit area and an increased power consumption.

SUMMARY OF THE INVENTION

The present invention contemplates an error correction device capable of rapid error correction while minimizing a storage element in capacity.

The present invention provides an error correction device including a first storage element, a first error correction operation circuit and a second error correction operation circuit.

The first storage element stores a product-code block having added thereto error correction codes provided in different directions. The first error correction operation circuit receives from the first storage element data in the product code block arranged in a first direction, and corrects an error in the first direction. The second error correction operation circuit receives from the first error correction circuit the data corrected by the first error correction circuit, and successively corrects an error in a second direction.

Thus the present invention can provide an error correction device capable of rapid error correction while minimizing circuit area and power consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the drawings:

FIG. 2 illustrates a product code block in the first embodiment;

DESCRIPTION OF THE PREFERRED EMBODIMENTS

First Embodiment

Figure 1:
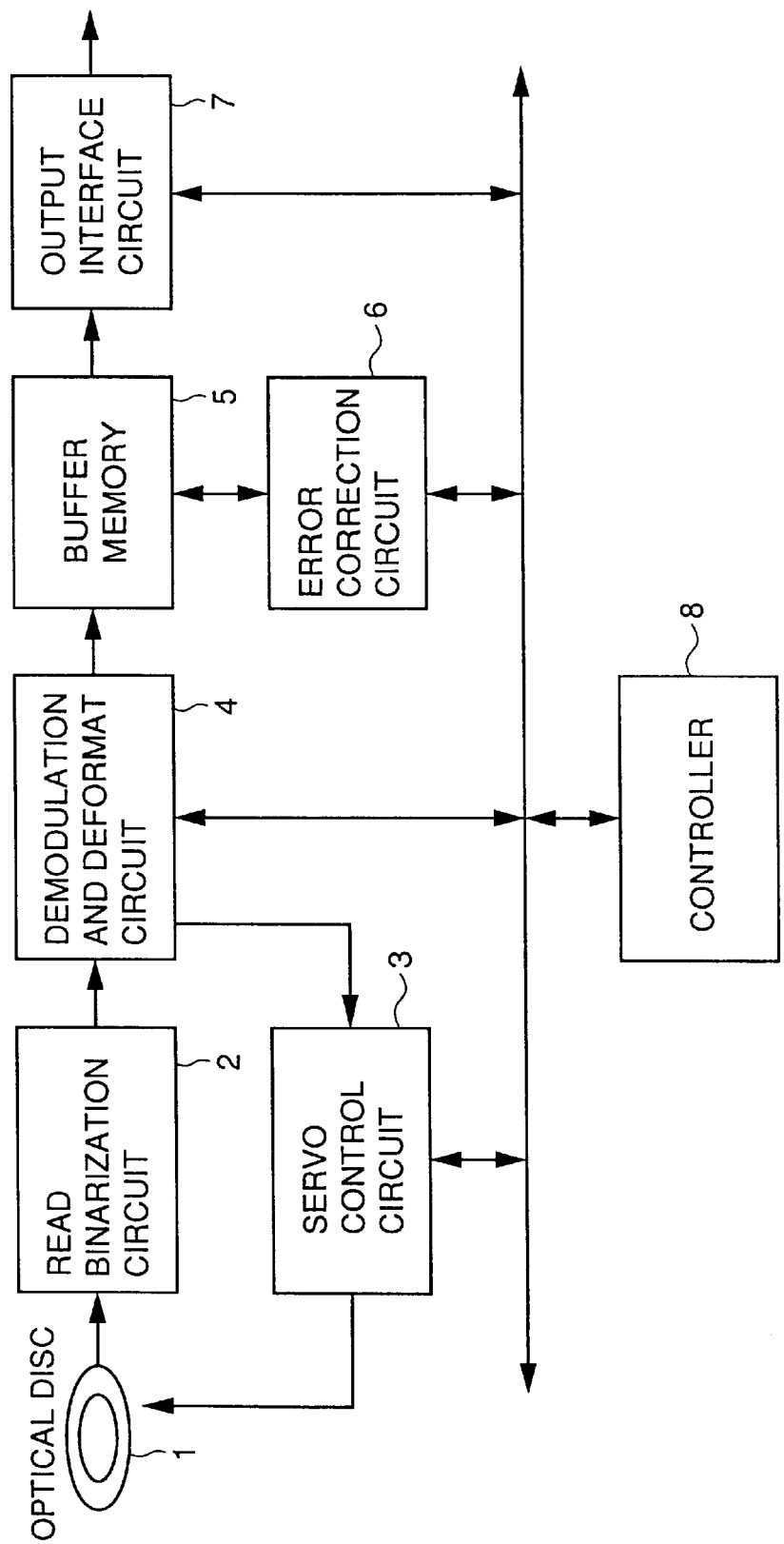
FIG. 1 is a schematic block diagram showing a configuration of an optical disc decoding system employing an error correction circuit of a first embodiment of the present invention.

A first embodiment implementing the present invention will now be described with reference to the drawings. Note that components thereof similar to those of the conventional example are denoted by the same reference characters as used in the conventional example and a description thereof will not be repeated.

FIG. 1 is a schematic block diagram showing a configuration of an optical disc decoding system employing an error correction device in accordance with the present invention. More specifically, FIG. 1 shows one example of a system decoding information from a digital video disc (DVD) or a similar optical disc.

Figure 13:
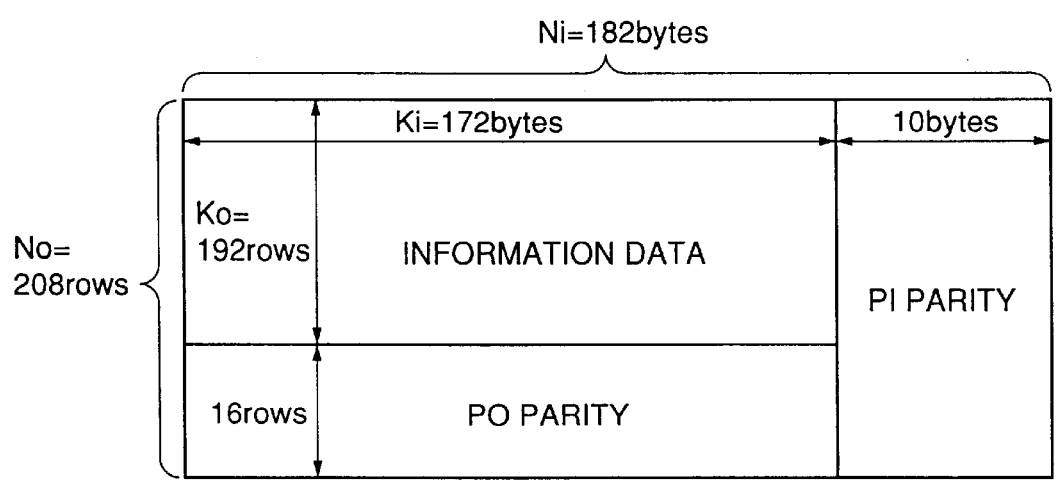
FIG. 13 schematically shows a manner in which a product code is added to digital data.
Figure 14:
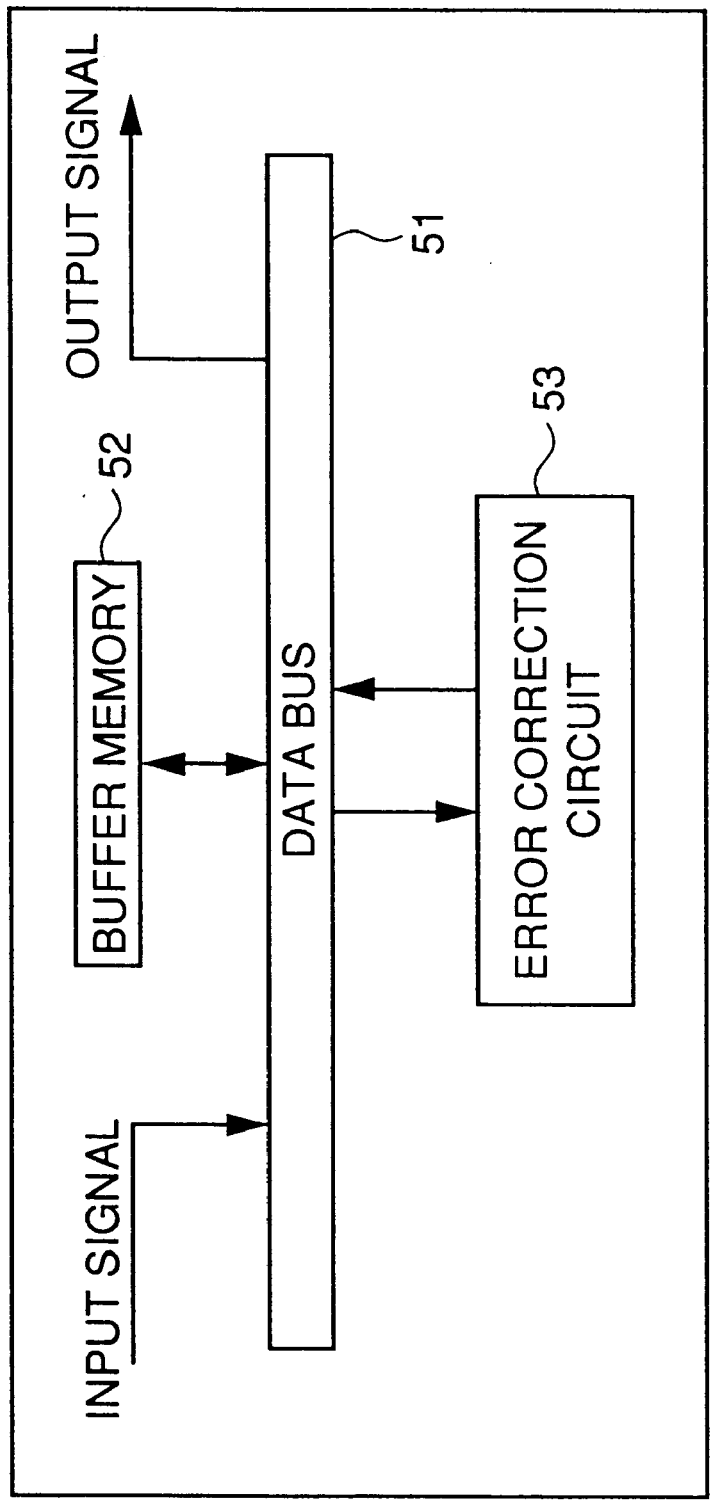
FIG. 14 is a block diagram simply showing a data transmission path in an error correction process provided by a first conventional error correction device.

In FIG. 1, a signal read from an optical disc 1 is received by a read binarization circuit 2 and thus converted into a digital signal and then fed to a demodulation and deformat circuit 4 and thus demodulated into a data block including a product code, as shown in FIG. 13.

FIG. 2 shows a configuration of a product code block of the first embodiment. As shown in FIG. 2, it is formed of data of 182B (COL181 to COL0) in the direction of the rows (the horizontal direction) and data of 208B (ROW0 to ROW207) in the direction of the columns (the vertical direction). More specifically, it is configured of information data in 172B (Bytes) columns by 192 rows with horizontal parity PI of 10B (Bytes) column by 208 rows and vertical parity PO of 172 columns by 16B (Bytes) row added thereto.

Again with reference to FIG. 1, the FIG. 2 data for one block is stored in a buffer memory 5 of an SDRAM. As such, if in buffer memory 5 horizontal, PI-system data is accessed it can be accessed in burst and data can thus be read in rapidly.

A servo control circuit 3 respond to an output of demodulation and deformat circuit 4 by servo controlling a mechanism (not shown) driving optical disc 1. Demodulation and deformat circuit 4 and servo control circuit 3 operate as controlled by a controller 8.

Controller 8 also issues to an error correction circuit 6 an instruction to decode (or provide error correction for) data of one block stored in buffer memory 5. In response to this instruction, error correction circuit 6 performs an error correction process on the data stored in buffer memory 5 and notifies controller 8 that the process has been completed. Error correction circuit 6 operates as controlled by controller 8.

Figure 3:
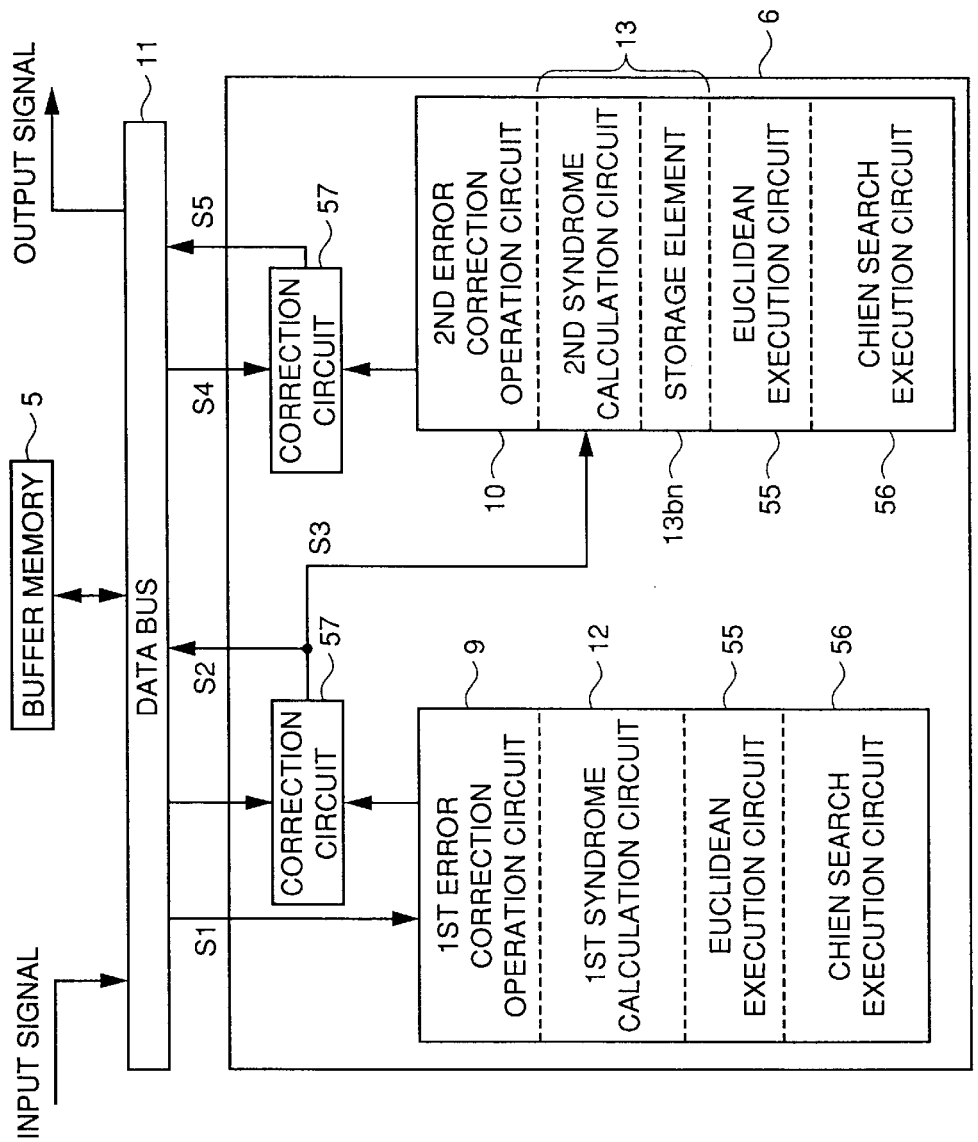
FIG. 3 is a schematic block diagram showing a configuration of an error correction circuit 6 in the first embodiment.

FIG. 3 is a block diagram showing in detail a configuration of the FIG. 1 error correction circuit 6.

In the FIG. 3, error correction circuit 6 includes a first error correction operation circuit 9, a second error correction operation circuit 10 and a data bus 11. The first error correction operation circuit 9 provides error correction for a code of a line in the horizontal direction (the PI system) of a data block stored in buffer memory 5 and including a product code. The second error correction operation circuit 10 provides error correction for a code of a line in the vertical direction (the PO system) of a data block including a product code that is corrected by the first error correction operation circuit 9. Data bus 11 is provided for data communication between buffer memory 5 and the first and second error correction operation circuits 9 and 10.

Figure 15:
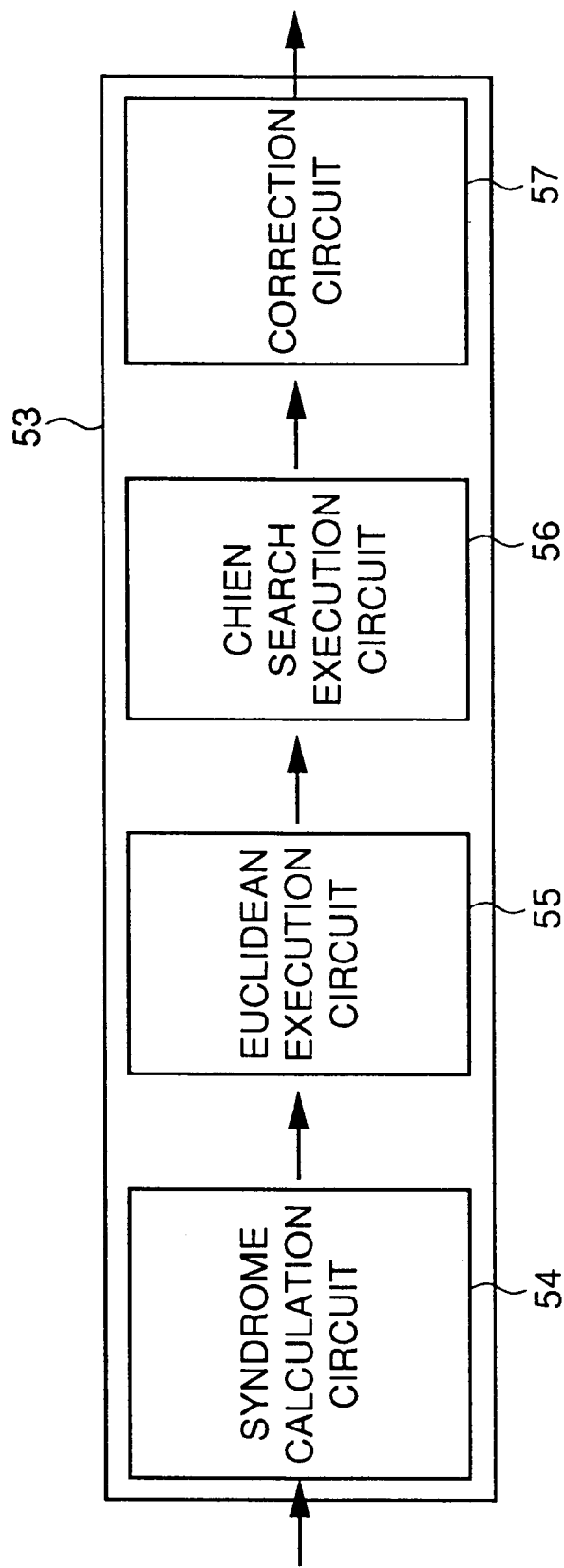
FIG. 15 is a block diagram schematically showing a typical error correction circuit.
Figure 16:
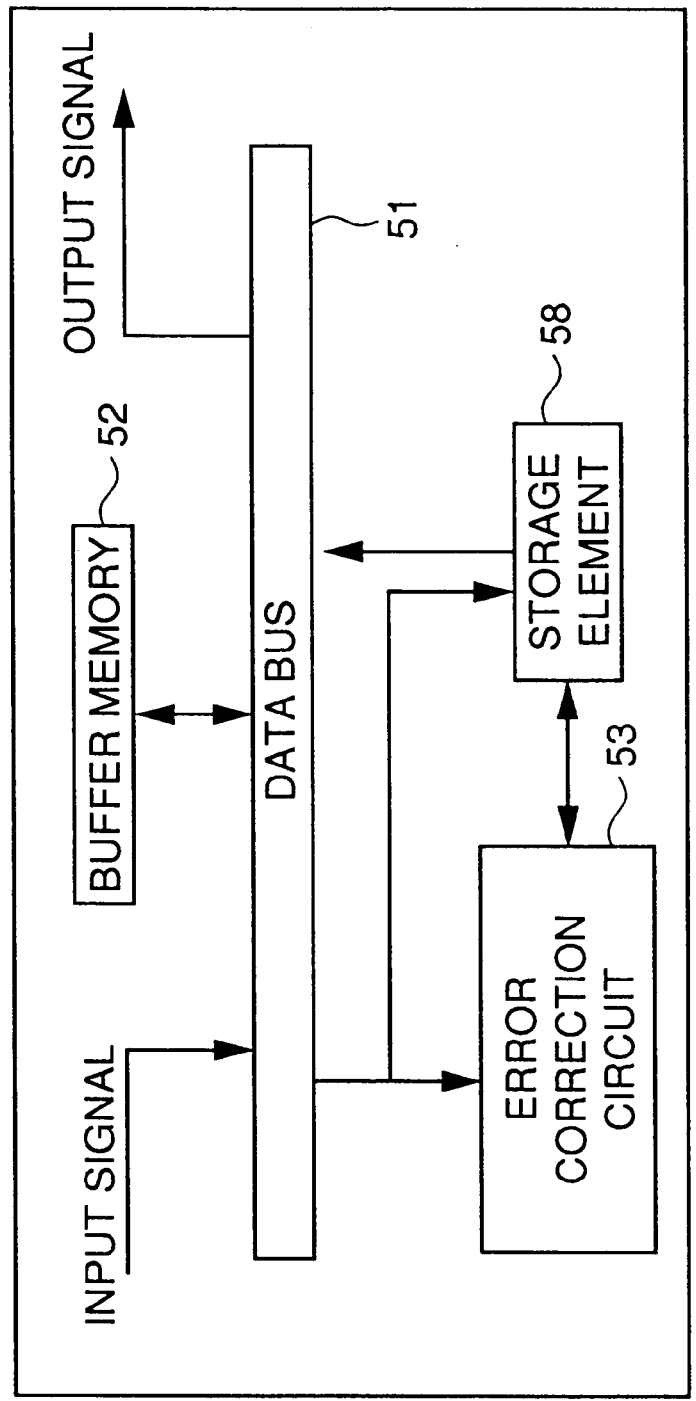
FIG. 16 is a block diagram schematically showing a second conventional error correction device.

The first error correction operation circuit 9 corresponds in configuration to the FIG. 15 error correction circuit 53 with syndrome calculation circuit 54 replaced by a first syndrome calculation circuit 12. Euclidean execution circuit 55, Chien search execution circuit 56 and correction circuit 57 are similarly configured.

Figure 4:
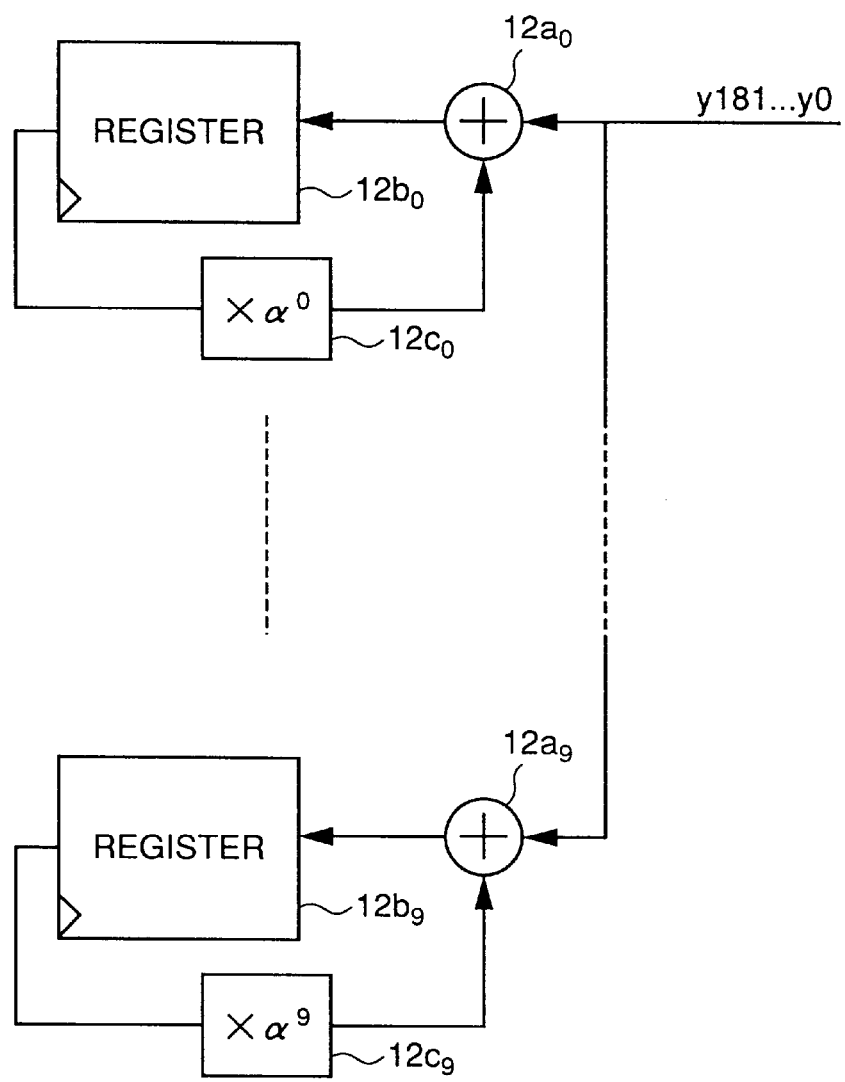
FIG. 4 is a block diagram schematically showing a first syndrome calculation circuit 12 in the first embodiment.

FIG. 4 is a block diagram showing a configuration of the first syndrome calculation circuit 12.

It is assumed that a polynomial representing a received code train including an error (a code polynomial) is represented by:

$$y(x) = y_{m-1}x^{m-1} + y_{m-2}x^{m-2} + \ldots + y_1 x + y_0$$

wherein m represents the number of the items of the received signal polynomial. For example, for the FIG. 2 product code block, if a code of a line of the PI system is subjected to error correction then m=182 and if a code of a line of the PO system is subjected to error correction then m=208.

As is well known, if receiving polynomial y (x) is represented as above then a syndrome is given by:

$$S_j = \sum_{i=m-1}^{o} yi(\alpha^j)^i \quad (j = 0, \ldots, 2t-1) \quad (1)$$

wherein t represents the number of errors that can be corrected and α represents a root of a primitive polynomial (a generating polynomial).

This syndrome calculating expression is implemented in the form of a circuit by the first syndrome calculation circuit 12. It should be noted, however, that expression (1) provides an exclusive OR operation rather than a simple sum.

With reference to FIG. 4, the first syndrome calculation circuit 12 includes an exclusive OR operation circuit 12ai, n registers 12bi and n multipliers 12ci to correspond to a root of a primitive polynomial $\alpha^0$, $\alpha$, ... $\alpha^j$, ... $\alpha^{n-1}$, respectively, wherein i=0 to (n−1).

Herein, in a primitive polynomial a root is $\alpha^0$, $\alpha$, ... $\alpha^j$, ... $\alpha^{n-1}$, having successive n numbers of 0 to (n−1) as their respective powers.

More specifically, corresponding to $\alpha^0$, exclusive OR circuit 12a0 has one input successively receiving data y181 to y0 and register 12b0 receives and holds an output provided from exclusive OR circuit 12a0. Multiplier 12c0 multiplies an output of register 12b0 by $\alpha^0$, and inputs it to exclusive OR circuit 12a0 at the other input. Similar circuits are provided for the other powers of root α.

For example, for such a DVD format as in the first embodiment, adding 10B parity PI is a requirement. Thus, n=10 (0 to 9) and in expression (1) j corresponds to 0, ..., 9, respectively.

Again, with reference to FIG. 3, the second error correction operation circuit 10 corresponds in configuration to the FIG. 15 error correction circuit 53 with syndrome calculation circuit 54 replaced by the second syndrome circulation circuit 13. Euclidean execution circuit 55, Chien search execution circuit 56 and correction circuit 57 are similarly configured.

Figure 5:
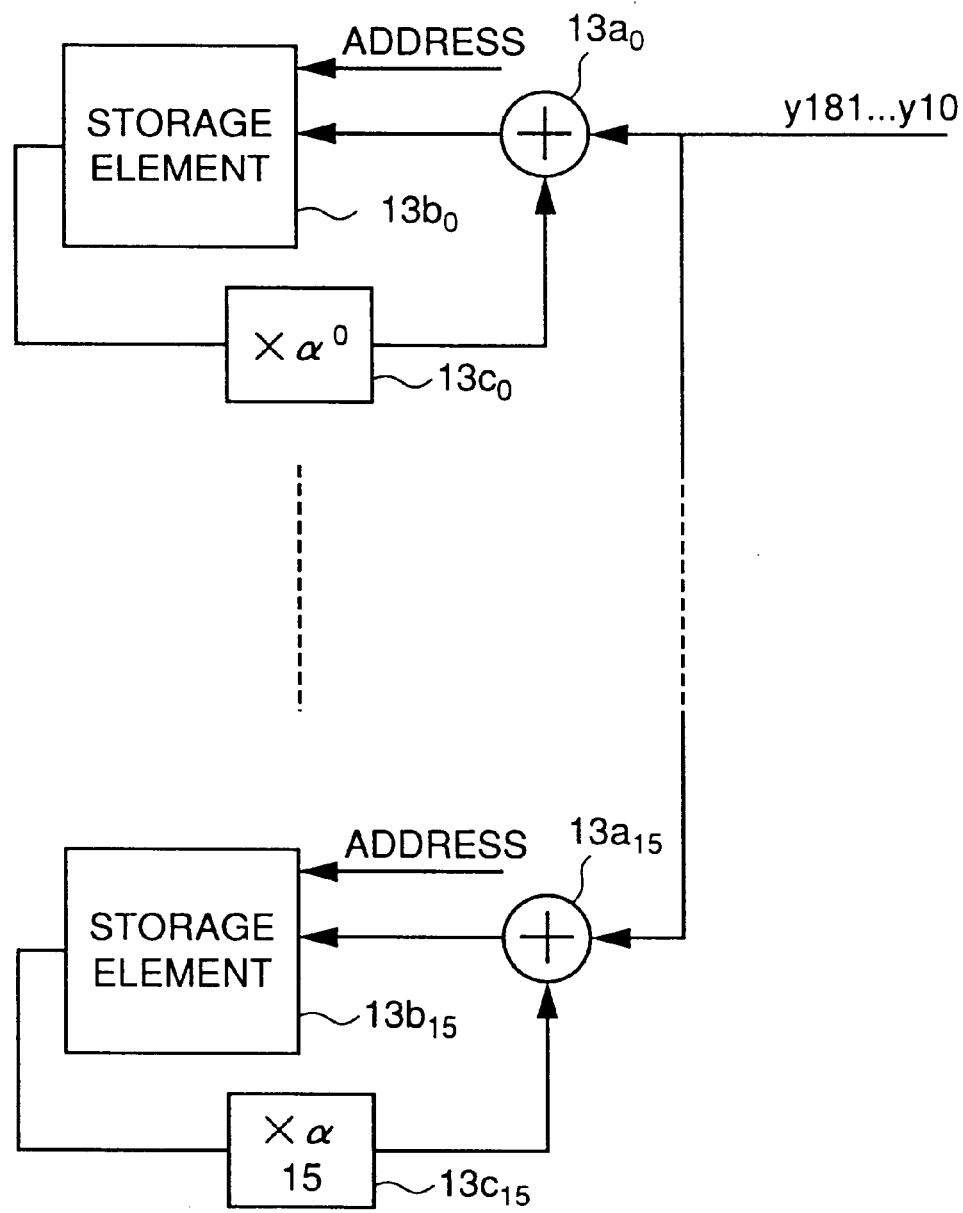
FIG. 5 is a block diagram schematically showing a second syndrome calculation circuit 13 in the first embodiment.

FIG. 5 is a block diagram showing a configuration of the second syndrome calculation circuit 13 of the second error correction operation circuit 10.

The second syndrome calculation circuit 13 is similar to the first syndrome calculation circuit 12 in that it functions to implement the syndrome calculation of expression (1).

With reference to FIG. 5, the second syndrome calculation circuit 13 includes n circuits configured of an exclusive OR circuit 13an, a storage element 13bn and a multiplier 13cn. There are included n circuits including an exclusive OR circuit 13ai, a storage element 13bi and a multiplier 13ci to correspond to a power of root α of a primitive polynomial, $\alpha^0$, ... $\alpha^j$, ... αn−1, respectively, wherein i=0 to (n−1).

More specifically, corresponding to $\alpha^0$, exclusive OR circuit 13a0 has one input successively receiving data y181 to y10 and storage element 13b0 receives and holds an output of exclusive OR circuit 13a0. Multiplier 13c0 multiplies an output of storage element 13b0 by $\alpha^0$ and inputs it to exclusive OR circuit 13a0 at the other input. Similar circuits are provided for the other powers of root α. Storage element 13b0 can successively store values obtained throughout a syndrome calculation and also be accessible randomly in response to an address signal and it is configured for example of a static semiconductor memory device (hereinafter referred to as an SRAM). Similar circuits are provided for the other powers of root α.

For example, for such a DVD format as in the first embodiment, adding 16B PO parity is a requirement. As such, in the second syndrome calculation circuit 13 n=16 (0 to 15) and in expression (1) j corresponds to 0, ..., 15, respectively.

Figure 6:
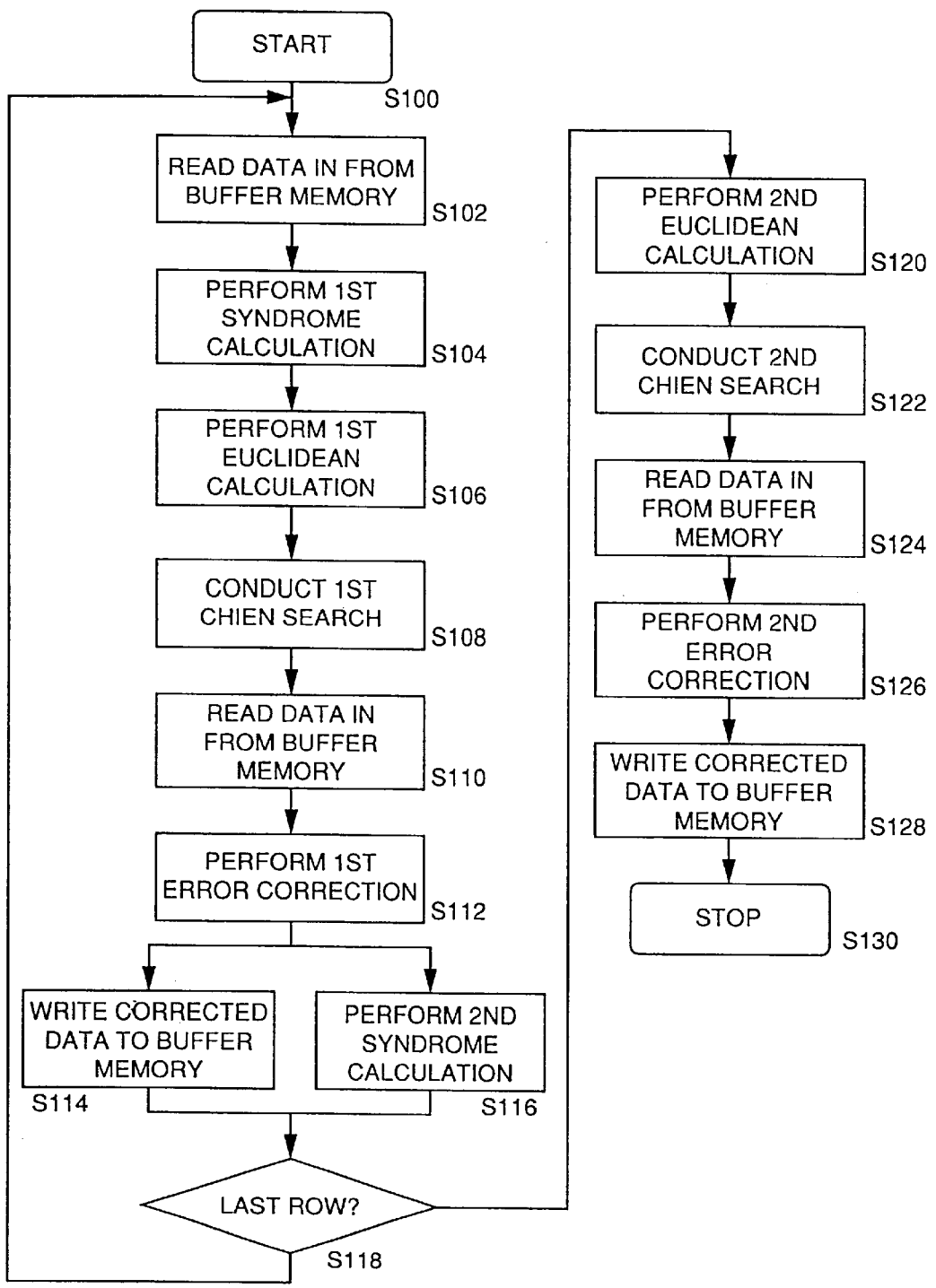
FIG. 6 is a flow chart for illustrating an operation of error correction circuit 6 shown in FIG. 3.

FIG. 6 is a flow chart for illustrating an operation of the FIG. 3 error correction circuit 6.

Hereinafter a description will be provided of an error correction operation of error correction circuit 6 configured as above, with reference to FIGS. 3 and 6.

When controller 8 issues a decode instruction to error correction circuit 6, error correction circuit 6 starts an error correction process on one block data including a product code (S100).

When the error correction process starts, initially, according to the flow described hereinafter, from buffer memory 5 to the first error correction operation circuit 9 the PI-system line data of ROW0 of FIG. 2 is transferred and the first error correction operation circuit 9 performs an error correction operation on a PI-system line code.

More specifically, from the FIG. 3 buffer memory to exclusive OR circuit 12a data yi is input for each line of the PI system of FIG. 2 product code block successively, wherein (i=181 to 0) (S102), and the operation result is temporarily accumulated in register 12bn, wherein n=0 to 9. Multiplier 12cn (n=0 to 9) multiplies the data stored in register 12bn by $\alpha^n$ (n=0 to 9) and the result and the subsequent data y (i−1) are operated on by exclusive OR operation circuit 12n. This process is repeated to calculate a syndrome (S104).

After the syndrome is calculated, Euclidean execution circuit 55 uses the syndrome to obtain an error location polynomial and an error estimation polynomial (S106) and Chien search execution circuit 56 uses the error location polynomial and the error estimation polynomial to obtain an error location and an error count value (S108).

Then, data before it is corrected is read from a buffer memory 5 (S110) and then subjected to a correction operation performed by correction circuit 57 including an exclusive OR operation circuit (S112). The corrected data is then transferred via data bus 11 to and stored in buffer memory 5 (S114).

Simultaneously, correction circuit 57 also transfers the corrected data to the second error correction operation circuit 10 at the second syndrome calculation circuit 13 and thus subjected to a second syndrome calculation therein (S116).

At S116, from the first error correction operation circuit 9 the PI-system line data yi corrected (i=181 to 10) is successively input to exclusive OR operation circuit 13an (n=0 to 15) and the operation result is accumulated in storage element 13bn (n=0 to 15), although note that for the PI-system line data of ROW0 there is note data previously accumulated in storage element 13b and (n=0 to 15) and its value is accumulated in storage element 13bn as it is.

More specifically, at S116 the PI-system line data of ROW0 of FIG. 2 is input to the second syndrome calculation circuit 13 and 172B data is stored in storage element 13bn.

Then, control determines whether the process has been performed on the remaining rows and thus reached the last ROW207 row (S118).

In the above-described process, the process for ROW0 is only completed. As such, control returns to S102.

As such, at S102 from buffer memory 5 the PI-system line data of ROW 1 is transferred and the first error correction operation circuit 9 performs an error correction operation on a code of a line of the PI system, and at S114 data corrected is transferred via data bus 11 to buffer memory 5 and subjected to error correction in buffer memory 5.

At S114, when the data corrected by the first error correction operation circuit 9 is transferred to buffer memory 5 it is also transferred simultaneously to the second error correction operation circuit 10 at the second syndrome calculation circuit 13. Initially, when the second syndrome calculation circuit 13 of FIG. 3 receives the PI-system line data Y (181) of ROW1, it reads y181 (the PI-system line data of ROW0) stored in storage element 13bn and transfers it to multiplier 13cn (n=0 to 15) to allow multiplier 13bn to multiply the line data by an (n=0 to 15) and the obtained result and the PI-system line data y181 of ROW1 are operated on by exclusive OR operation circuit 13an and the obtained value is over written on the data stored in storage element 13bn and corresponding to y181.

Similarly, whenever the PI-system line data yi of ROW1 is input, data corresponding thereto is read from storage element 13bn and operated on by exclusive OR operation circuit 13an and the obtained value is overwritten on the data stored in storage element 13bn and corresponding to yi. Since in storage element 13bn new data are only overwritten successively, it only requires an extremely small storage capacity allowing data of 172B (=182B−10B)×n (=16) to be stored.

It should be noted that this process provided by the second syndrome calculation circuit 13 corresponds to the "error correction process" recited in the claims.

When the above S102–S116 process is repeated and thus reaches the FIG. 2 ROW 207, an error correction operation completes for a code of all lines of the PI system and a syndrome calculation also completes for a code of all lines of the PO system.

After the syndrome is calculated, Euclidean execution circuit 55 uses the syndrome to obtain an error location polynomial and an error estimation polynomial (S120) and Chien search execution circuit 56 uses the error location polynomial and the error estimation polynomial to obtain an error location and an error count value (S112).

Then, code data corresponding thereto is read from buffer memory 5 (S124), corrected by correction circuit 57 including an exclusive OR operation circuit (S126), and then again written to buffer memory 5 (S128).

Figure 7:
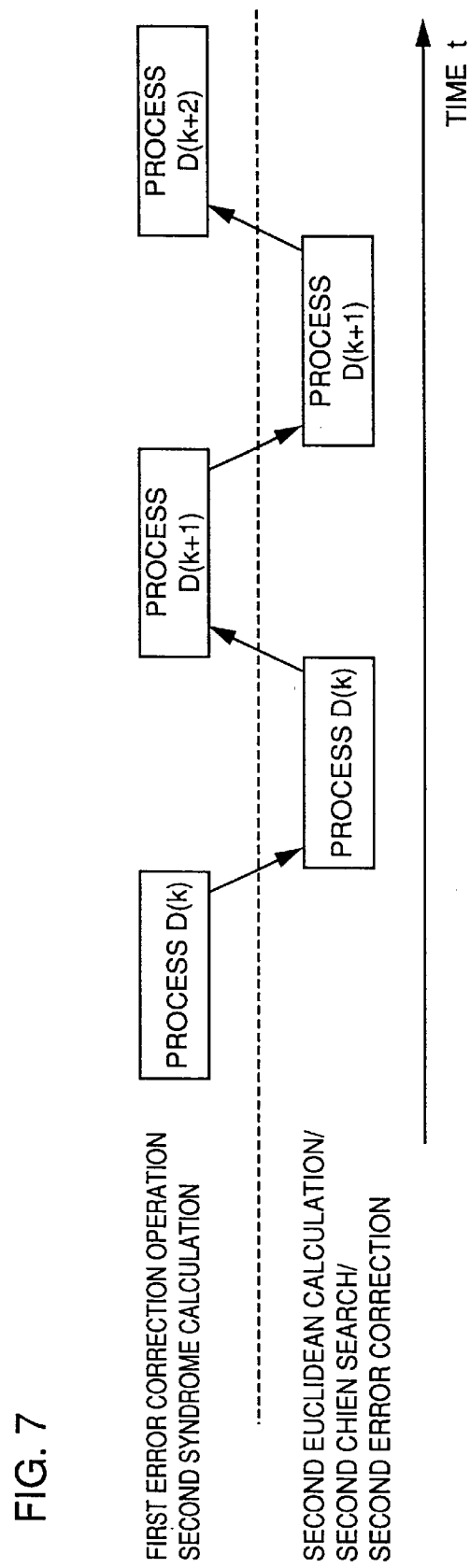
FIG. 7 shows a concept representing a process provided by an error correction circuit 10 to successively process a product code block Dk, wherein k represents a natural number.

FIG. 7 is a diagram of a concept representing a process through which error correction circuit 10 processes product code block Dk successively, wherein k represents a natural number.

In error correction circuit 10 of the first embodiment, initially the first error correction operation and the second syndrome calculation circuit 13 operation are completed for product code block Dk and furthermore the second Euclidean calculation, the second Chien search and the second error correction operation are completed therefor and then the first error correction operation and the second syndrome calculation circuit 13 operation start for the subsequent product code block D (k+1).

The error correction device of the first embodiment as has been described above can provide the following effects:

(1) storage element 13bn stores developments in the course of a syndrome calculation and overwrites new data successively whenever new data is input. As such, it only requires an extremely small storage capacity, which can reduce circuit area and power consumption.

For example, if the amount of data is estimated that is required for a syndrome calculation in the PO direction for one block for a DVD format, then for the FIG. 13 storage element 58, 8 bit×208×172~286 kbit whereas for storage element 13bn of the first embodiment, 172×8 bit×16~22 kbit and the latter only requires approximately 1/10 of a conventional storage capacity; and (2) When the data corrected by the first error correction operation circuit 9 is transferred to buffer memory 5, it is also transferred simultaneously to the second error correction operation circuit 10 at the second syndrome calculation circuit 13. As such, buffer memory 5 can be accessed less frequently and accordingly an error correction process can be performed rapidly.

For example, if data of one line in the PI direction are all read in a single burst access, data of one line in the PO direction are read in one byte at a time, in error correction a write is provided byte by byte, an access requires a time of four cycles and there are 800 errors in each of the PI and PO directions, then in the FIG. 11 circuit each process requires a number of cycles, as follows:

In the PI direction a read requires a number of cycles:

PIR=(182 +4)×208=38688 cycles

In the PI direction an error correction requires a number of cycles:

PIE=800×(1+4)=4000 cycles

In the PO direction a read requires a number of cycles:

POR=(1+4)×208×172=178880 cycles

In the PO direction an error correction requires a number of cycles:

POE=800×(1+1+4)=4800 cycles

Thus a total of 226,368 cycles is required.

In contrast, for the error correction device of the first embodiment, POR is not required (0) and a total of 47,488 cycles is thus required. As such, the process can be provided in a short period of time.

Second Embodiment

A second embodiment of the present invention will now be described with reference to the drawings.

Figure 8:
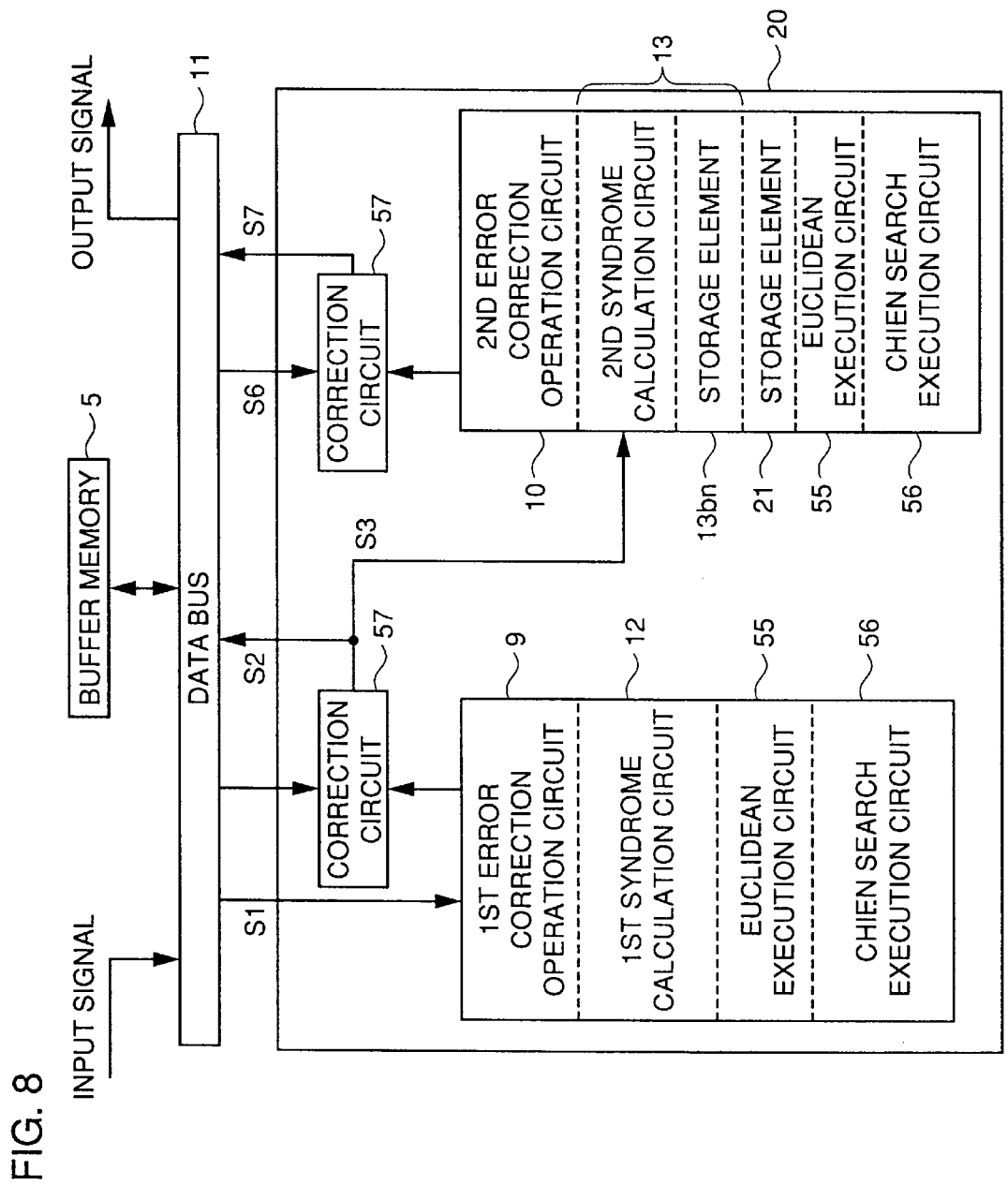
FIG. 8 is a schematic block diagram showing a configuration of an error correction circuit 20 in a second embodiment of the present invention.
Figure 9:
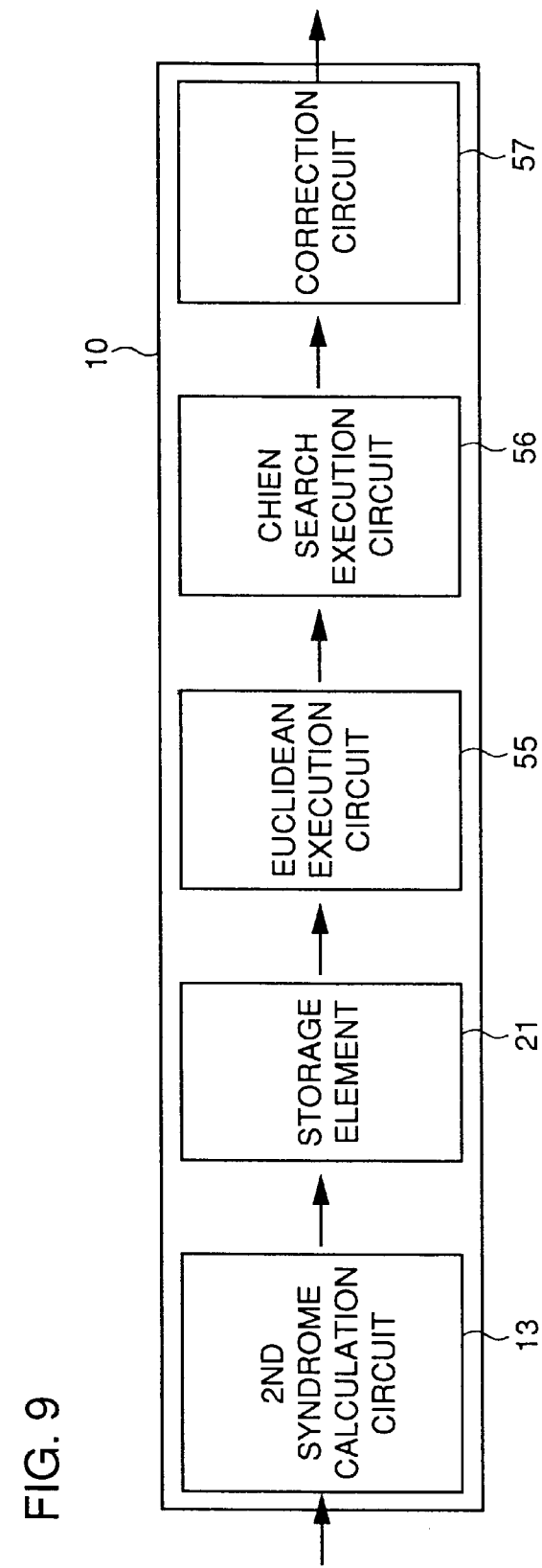
FIG. 9 is a block diagram schematically showing a second error correction operation circuit 10 in the second embodiment.

FIG. 8 is a block diagram specifically showing a configuration of an error correction circuit 20 in the second embodiment of the present invention. FIG. 9 is a schematic block diagram for illustrating a configuration of a second error correction operation circuit 10 in the second embodiment of the present invention.

The second error correction operation circuit 10 of the second embodiment is distinguished from that of the first embodiment only in that as shown in FIG. 9 it is provided with a storage element 21 between the second syndrome calculation circuit 13 and Euclidean execution circuit 55.

Note that storage element 21 may be an SRAM, although it is not limited thereto. Furthermore, storage element 21 is adapted to have a storage capacity capable of holding a syndrome that the second syndrome calculation circuit 13 calculates for the FIG. 2 product code block.

More specifically, in the second embodiment, in the FIG. 6 process flow of the first embodiment a syndrome that the second syndrome calculation circuit 13 calculates for product code block Dk is temporarily held in storage element 21 and the data held in storage element 21 (the syndrome) is used to calculate an error location polynomial and an error count value polynomial through a Euclidean method (S120) and calculate an error location and an error count value through a Chien search method (S122) and correction circuit 57 reads corresponding code data from buffer memory 52 (S124) and corrects the read data (S126) and writes the corrected data again to buffer memory (S128).

While the S120–S128 process is being provided, the second syndrome calculation circuit 13 calculates a syndrome for the subsequent product code block D (k+1).

Figure 10:
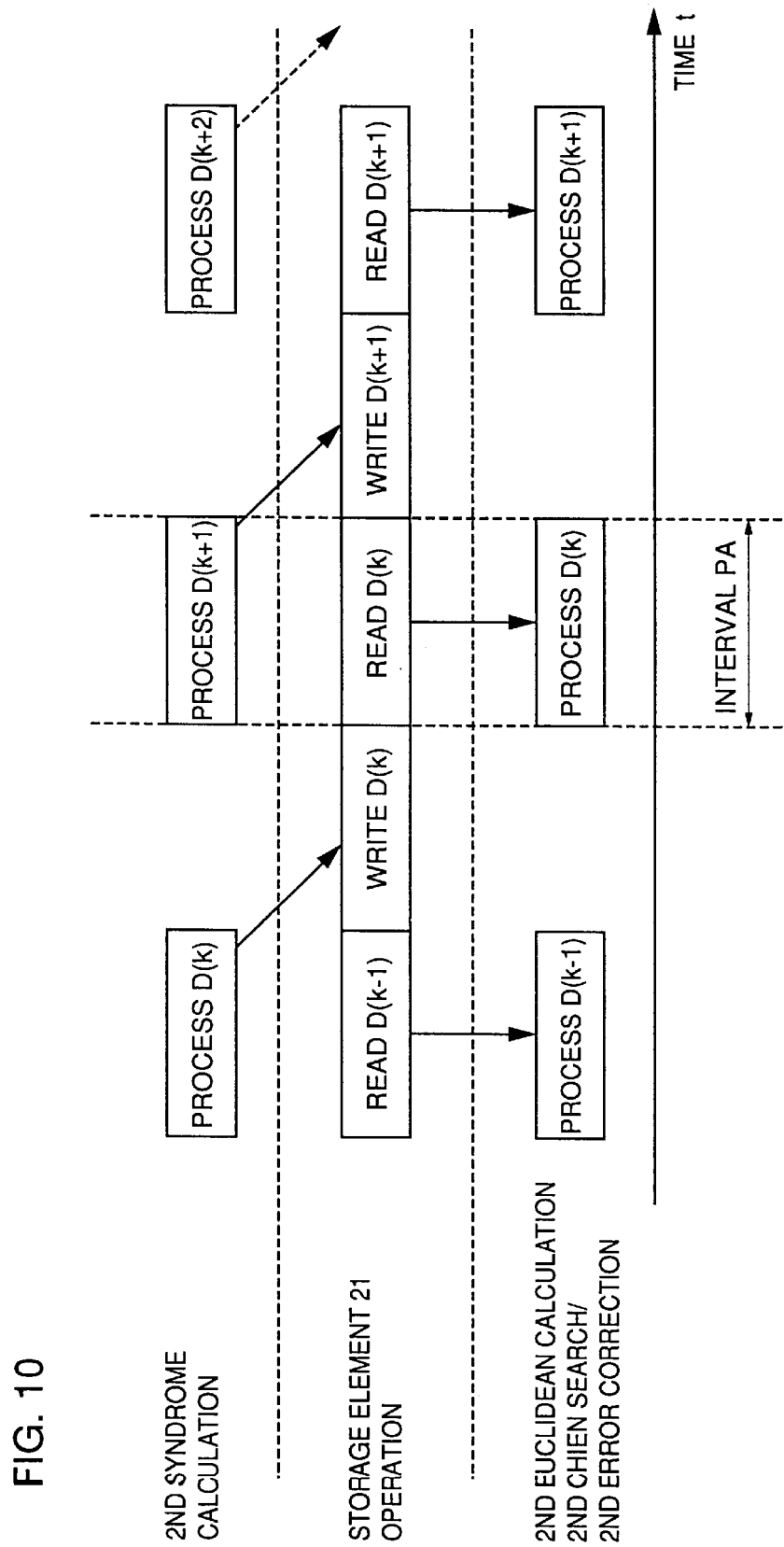
FIG. 10 represents a concept representing a process provided by an error correction circuit 20 of the second embodiment to successively process product code block Dk, wherein k represents a natural number.

FIG. 10 is a diagram representing a concept representing a process through which error correction circuit 20 processes product code block Dk successively, wherein k represents a natural number.

In FIG. 10, for example, in an interval PA product code block Dk stored in storage element 21 and product code block Dk+1 can be processed in parallel. More specifically, for product code block Dk, a result of the second syndrome calculation therefor can be read, the second Euclidean calculation can be performed, the second Chien search can be conducted and the second error correction can be provided, while for product code block D (k+1) the second syndrome calculation process can be performed.

Note that if storage element 21 has a 2-bank configuration then for example there can also be provided in parallel reading a syndrome for product code block Dk and writing a syndrome for product code block D (k+1).

More specifically, in the second embodiment, there can be provided in parallel providing error correction for the kth product code block Dk in the PO direction and calculating a syndrome for the (k+1)th product code block D (k+1) in the PO direction, to provide an error correction process more rapidly than in the first embodiment.

Third Embodiment

A third embodiment of the present invention will be described with reference to the drawings.

Figure 11:
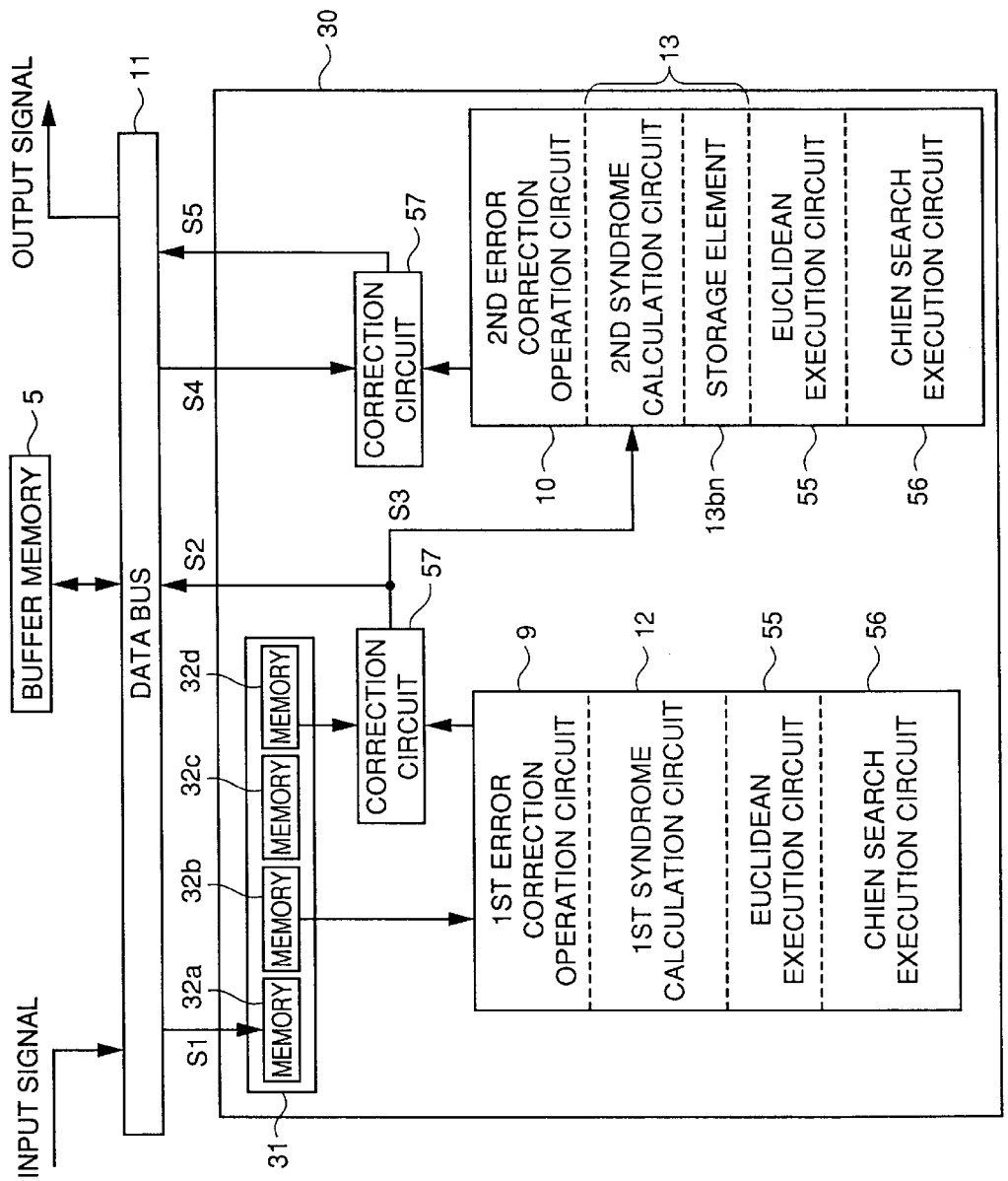
FIG. 11 is a block diagram showing a configuration of an error correction circuit 30 in a third embodiment of the present invention.

FIG. 11 is a block diagram showing in detail a configuration of an error correction circuit 30 in the third embodiment.

The third embodiment is distinguished from the first embodiment only in that a storage element 31 is provided between buffer memory 5 and the first error correction operation circuit 9, and the remaining configuration thereof is similar to the configuration of error correction circuit 10 of the first embodiment. Furthermore, storage element 31 is internally sectionalized into four banks 32a to 32d adapted to allow data to be written thereto and read therefrom independently from each other. Herein, storage element 31 may for example be an SRAM having a 4-bank configuration, although it is not limited thereto.

Configured as shown in FIG. 11, the third embodiment provides error correction circuit 30 controlled by controller 8 to allow the first error correction operation circuit 9 to pipeline-process for each line of data the data of one block including a product code block.

Figure 12:
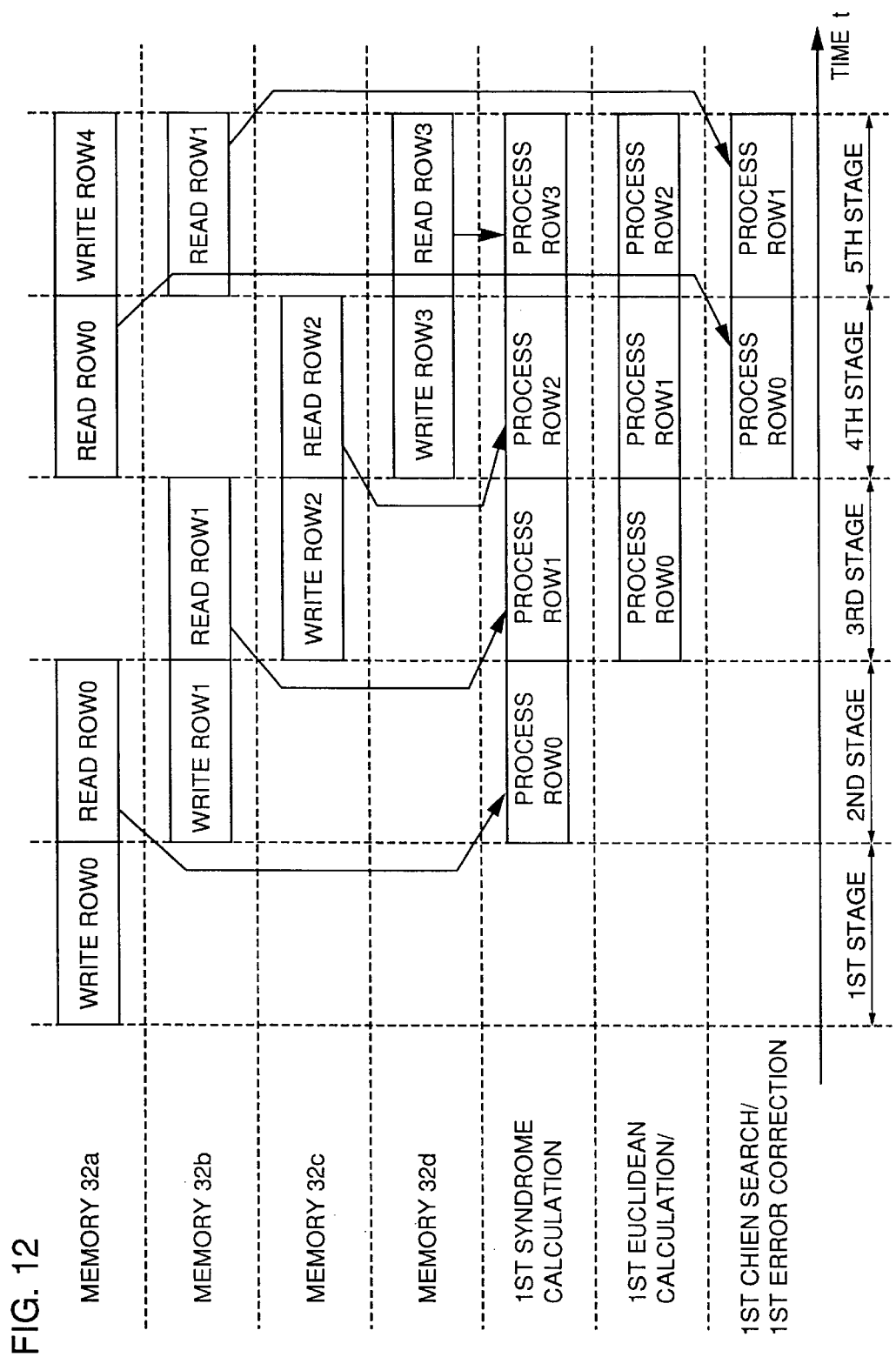
FIG. 12 is timing plots for representing an operation of error correction circuit 30 of the third embodiment.

FIG. 12 represents a concept for illustrating an operation of error correction circuit 30.

Hereinafter, reference will be made to FIGS. 11 and 12 to describe the error correction circuit 30 operation.

When controller 8 issues a decode instruction to error correction circuit 30, error correction circuit 30 starts an error correction process for the data of one data block including a product code.

Initially, at stage 1 the PI-system line data of ROW0 as shown in FIG. 2 is transferred from buffer memory 5 to bank 32a of storage element 31.

Subsequently, stage 2 provides in parallel the following operations:

i) The PI-system line data of ROW1 as shown in FIG. 2 is transferred from buffer memory 5 to bank 32b of the storage element 31; and ii) The PI-system line data of ROW0 is transferred from bank 32a to the first syndrome calculation circuit 12 and subjected to a syndrome calculation similarly as in the first embodiment.

Subsequently, stage 3 provides in parallel the following operation:

iii) The PI-system line data of ROW2 as shown in FIG. 2 is transferred from buffer memory 5 to bank 32c of the storage element 31;

iv) The PI-system line data of ROW1 is transferred from bank 32b to the first syndrome calculation circuit 12 and subjected to a syndrome calculation; and v) The syndrome data of the PI-system line data of ROW0 are transferred from the first syndrome calculation circuit 12 to Euclidean execution circuit 55 to obtain an error location polynomial and an error estimation polynomial.

Subsequently, stage 4 provides in parallel the following operations:

vi) The PI-system line data of ROW3 as shown in FIG. 2 is transferred from buffer memory 5 to bank 32d of the to storage element 31;

vii) The PI-system line data of ROW2 is transferred from bank 32c to the first syndrome calculation circuit 12 and subjected to a syndrome calculation;

viii) The syndrome data of the PI-system line data of ROW1 are transferred from the first syndrome calculation circuit 12 to Euclidean execution circuit 55 to obtain an error location polynomial and an error estimation polynomial; and ix) The error location polynomial and error estimation polynomial of the PI-system line data of ROW0 are transferred from Euclidean execution circuit 55 to Chien search execution circuit 56 to obtain an error location and an error count value and furthermore data is read from a bank 32a of the storage element 31 and corrected by correction circuit 57.

Subsequently, stage 5 provides in parallel the following operations:

x) The PI-system line data of ROW4 as shown in FIG. 2 is transferred from buffer memory 5 to the bank 32a of the storage element 31;

xi) The PI-system line data of ROW3 is transferred from bank 32b to the first syndrome calculation circuit 12 and subjected to a syndrome calculation;

xii) The syndrome data of the PI-system line data of ROW2 are transferred from the first syndrome calculation circuit 12 to Euclidean execution circuit 55 to obtain an error location polynomial and an error estimation polynomial; and xiii) The error location polynomial and error estimation polynomial of the PI-system line data of ROW1 are transferred from Euclidean execution circuit 55 to Chien search execution circuit 56 to obtain an error location and an error count value and furthermore data is read from the bank 32b of the storage element 31 and corrected by correction circuit 57.

Note that when the data corrected by correction circuit 57 is transferred to buffer memory 5, it is also transferred simultaneously to the second error correction operation circuit 10 at the second syndrome calculation circuit 13.

Thereafter, the second error correction operation circuit 10 operates as in the S116–S118 operations of the first embodiment as shown in FIG. 6.

Note that from stage 6 onward a pipeline process is performed with PI-system line data as one unit, as in stage 5 as described above.

Thus in the third embodiment storage element 31 can be provided with four banks 32a to 32d to have data as required, to eliminate the necessity of frequently accessing buffer memory 5, so as to provide an efficient pipeline process. Thus there can be provided a faster error correction process.

Note that while the third embodiment provides a 4-stage pipeline operation, it is not limited thereto and the number of pipeline stages and the number of the banks in storage elements 31 can be appropriately determined depending on the specification of error correction circuit 30.

Note that, as in the second embodiment, storage element 21 may further be provided.

Furthermore, there may be provided a pipeline control including not only the process in the first error correction operation circuit 9 but that in the second error correction operation circuit 10.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An error correction device comprising:

a first storage circuit storing a product code block having added thereto error correction codes provided in different directions;

a first error correction operation circuit receiving from said first storage circuit data included in said product code block and arranged in a first direction, and performing a first error correction process with respect to said first direction; and a second error correction operation circuit receiving the data corrected by said first error correction operation circuit, and successively providing a second error correction process for data included in said product code block and arranged in a second direction, wherein in burst mode the first storage circuit accesses the data included in the product code block in said first direction and allows randomly accessing the data included in the product code block in the second direction.

2. An error correction device comprising:

a first storage circuit storing a product code block having added thereto error correction codes provided in different directions;

a first error correction operation circuit receiving from said first storage circuit data included in said product code block and arranged in a first direction, and performing a first error correction process with respect to said first direction;

a second error correction operation circuit receiving the data corrected by said first error correction operation circuit, and successively providing a second error correction process for data included in said product code block and arranged in a second direction;

said first error correction operation circuit performs said first error correction process for each unit block having the data included in said product code block and arranged in said first direction; and said second error correction operation circuit successively receives the data for each said unit block corrected by said first error correction operation circuit, and performs said second error correction process divisionally for each data included in said unit block.

3. The error correction device according to claim 2, wherein:

said second error correction process includes a syndrome calculation process for the data arranged in said second direction; and said second error correction operation circuit performs said syndrome calculation process by dividing said syndrome calculation operation for each data included in said unit block, and accumulating the results of the divided syndrome calculation operation in said second direction.

4. The error correction device according to claim 3, wherein said first error correction operation circuit sends corrected data to said first storage circuit and also to said second error correction operation circuit.

5. The error correction device according to claim 2-wherein: said second error correction operation circuit includes a plurality of accumulation circuits respectively provided for a plurality of roots of a primitive polynomial of a code formed of data arranged in said second direction, each said accumulation circuit including an exclusive logical sum operation circuit having one input successively receiving data included in said unit block and corrected by said first error correction operation circuit, a second storage circuit according to locations of the data in said unit block to store outputs of said exclusive logical sum operation circuit at respective addresses, and a multiplier circuit multiplying data having already been stored in said second storage circuit and corresponding to a location of data in said unit block input to said exclusive logical sum operation circuit at one input, by a corresponding one of said plurality of roots, and outputting the multiplied data to the other input of said exclusive logical sum operation circuit.

6. The error correction device according to claim 5, wherein said second storage circuit overwrites and thus stores outputs of said exclusive logical sum operation circuit at respective addresses depending on locations of the data in said unit block.

7. The error correction device according to claim 5, wherein said first error correction operation circuit sends corrected data to said first storage circuit and also to said second error correction operation circuit.

8. The error correction device according to claim 5, wherein said error correction code is a Reed-Solomon code.

9. The error correction device according to claim 2 wherein said first storage circuit allows accessing in burst the data included in said product code block and arranged in said first direction and allows randomly accessing the data included in said product code block and arranged in said second direction.

10. The error correction device according to claim 2, wherein:

said first error correction operation circuit includes a first syndrome calculation circuit calculating a syndrome of the data included in said product code block and arranged in said first direction; and said second error correction operation circuit includes a second syndrome calculation circuit successively receiving data for each said unit block corrected by said first error correction operation circuit, and provides a syndrome calculation process for the data arranged in said second direction that is divisionally performed for each data included in said unit block, and accumulated in said second direction.

11. The error correction device according to claim 10 wherein: said first syndrome calculation circuit includes a plurality of first accumulation circuits respectively provided for a plurality of roots of a primitive polynomial of a code formed of data arranged in said first direction, each said first accumulation circuit including a first exclusive logical sum operation circuit having one input successively receiving data included in said unit block and read from said first storage circuit, a second storage circuit storing outputs of said first exclusive logical sum operation circuit, and a first multiplier circuit multiplying data having already been stored in said second storage circuit by a corresponding one of said plurality of roots and outputting the multiplied data to the other input of said first exclusive logical sum operation circuit.

12. The error correction device according to claim 10 wherein: said second syndrome calculation circuit includes a plurality of second accumulation circuits respectively provided for a plurality of roots of a primitive polynomial of a code formed of data arranged in said second direction, each said second accumulation circuit including a second exclusive logical sum operation circuit having one input successively receiving data included in said unit block corrected by said first error correction operation circuit, a third storage circuit according to a location of data in said unit block to store outputs of said second exclusive logical sum operation circuit at respective addresses, and second multiplier circuit multiplying data having already been stored in said third storage circuit and corresponding to a location of data in said unit block input to said second exclusive logical sum operation circuit at one input, by a corresponding one of said plurality of roots, and outputting the multiplied data to the other input of said second exclusive logical sum operation circuit.

13. The error correction device according to claim 12, wherein said third storage circuit overwrites and thus stores outputs of said second exclusive logical sum operation circuit at respective addresses depending on locations of the data in said unit block.

14. The error correction device according to claim 10, wherein said second error correction operation circuit further includes a fourth storage circuit temporarily holding a result of a syndrome calculation provided by said second syndrome calculation circuit for each said product code block in said second direction.

15. The error correction device according to claim 14, wherein:

said second error correction operation circuit further includes a second-direction correction circuit, based on the result of the syndrome calculation in said fourth storage circuit, detecting an error location and error count value of said product code block to perform error correction in said second direction; and said first error correction operation circuit performs an error correction process for a subsequent product code block in parallel with said second-direction correction circuit performing the error correction.

16. The error correction device according to claim 15, wherein said first error correction operation circuit sends corrected data to said first storage circuit and also to said second syndrome calculation circuit.

17. The error correction device according to claim 10, further comprising:

a fifth storage circuit having a plurality of storage regions, provided in a course of a data transfer path from said first storage circuit to said first error correction operation circuit, for respectively storing data subject to an correction process in said first error correction operation circuit; and control means for controlling the error correction process in said first error correction operation circuit for data stored in said fifth storage circuit, to be pipeline-processed for each said unit block.

* * * * *